United States Patent
Lin et al.

(10) Patent No.: US 10,455,736 B2
(45) Date of Patent: Oct. 22, 2019

(54) REDUCED COST AND SCHEDULE MANUFACTURING OF GRAPHENE PAPER BASED THERMAL STRAPS/HARNESSES

(71) Applicant: Raytheon Company, Waltham, MA (US)

(72) Inventors: Stephanie Lin, Redondo Beach, CA (US); James R. Chow, San Gabriel, CA (US); Carl W. Townsend, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/657,019

(22) Filed: Jul. 21, 2017

(65) Prior Publication Data

US 2019/0029141 A1    Jan. 24, 2019

(51) Int. Cl.
| | | |
|---|---|---|
| *H05K 7/20* | (2006.01) | |
| *C25D 3/38* | (2006.01) | |
| *C25D 3/46* | (2006.01) | |
| *C25D 7/06* | (2006.01) | |
| *C25D 7/00* | (2006.01) | |
| *G06F 17/50* | (2006.01) | |
| *H01L 23/373* | (2006.01) | |
| *B64G 1/50* | (2006.01) | |
| *C25D 5/54* | (2006.01) | |
| *F28F 21/02* | (2006.01) | |
| *H01L 23/367* | (2006.01) | |

(52) U.S. Cl.
CPC ............ *H05K 7/2039* (2013.01); *B64G 1/50* (2013.01); *C25D 3/38* (2013.01); *C25D 3/46* (2013.01); *C25D 5/54* (2013.01); *C25D 7/006* (2013.01); *C25D 7/0614* (2013.01); *G06F 17/5086* (2013.01); *H01L 23/373* (2013.01); *F28F 21/02* (2013.01); *F28F 2255/06* (2013.01); *H01L 23/367* (2013.01)

(58) Field of Classification Search
CPC .............. H01L 23/373; H01L 29/1606; H01L 51/0048; H01L 23/3735; H01L 2224/16225; H01L 23/3736; H01L 23/3737; H01L 23/3733; H01L 23/367; H01L 21/02527; H01M 4/366; H01M 4/587; H01M 4/625; H05K 2201/0323
See application file for complete search history.

(56) References Cited

U.S. PATENT DOCUMENTS

| | | |
|---|---|---|
| 5,077,637 A | 12/1991 | Martorana et al. |
| 6,286,591 B1 | 9/2001 | Bonneville |
| 6,367,509 B1 * | 4/2002 | Bonneville ............. F28F 21/02 138/109 |
| 9,233,850 B2 * | 1/2016 | Jang ..................... B82Y 30/00 |
| 9,359,208 B2 * | 6/2016 | Zhamu .................... C09K 5/14 |
| 9,440,856 B2 * | 9/2016 | Coleman .............. C01B 31/0446 |
| 9,924,619 B2 * | 3/2018 | Kim ..................... H05K 9/0088 |

(Continued)

FOREIGN PATENT DOCUMENTS

WO    2014/052282 A1    4/2014

*Primary Examiner* — Adam B Dravininkas

(57) ABSTRACT

A graphene strip includes a plurality of graphene strips, a metal additive and a binding material is provided. The plurality of graphene strips include strips of graphene nanoplatelets. The metal additive is applied to each of the plurality of graphene strips. The binding material couples the plurality of graphene strips together.

20 Claims, 2 Drawing Sheets

(56) References Cited

U.S. PATENT DOCUMENTS

| | | | | |
|---|---|---|---|---|
| 2013/0264041 | A1* | 10/2013 | Zhamu | H01L 23/373 |
| | | | | 165/185 |
| 2013/0266729 | A1* | 10/2013 | Lin | C01B 31/0446 |
| | | | | 427/265 |
| 2013/0309565 | A1* | 11/2013 | He | H01M 4/668 |
| | | | | 429/211 |
| 2014/0293513 | A1* | 10/2014 | Eilertsen | H01G 9/042 |
| | | | | 361/528 |
| 2015/0077899 | A1* | 3/2015 | Welch | H01G 11/28 |
| | | | | 361/502 |
| 2015/0086881 | A1* | 3/2015 | Zhamu | H01G 11/68 |
| | | | | 429/405 |
| 2016/0057854 | A1* | 2/2016 | Schneider | B32B 9/007 |
| | | | | 174/252 |
| 2016/0086829 | A1* | 3/2016 | Limary | F26B 5/00 |
| | | | | 216/87 |
| 2017/0354190 | A1* | 12/2017 | Cauchy | A41D 13/005 |
| 2018/0240886 | A1* | 8/2018 | Venugopal | H01L 29/66045 |

* cited by examiner

REDUCED COST AND SCHEDULE MANUFACTURING OF GRAPHENE PAPER BASED THERMAL STRAPS/HARNESSES

TECHNICAL FIELD

This disclosure is directed in general to manufacture of thermal straps. More specifically, this disclosure relates to a system and method for reducing the cost and schedule for manufacturing of graphene paper based thermal straps and harnesses.

BACKGROUND

Thermal straps manufactured out of metal strips (i.e., copper or aluminum), carbon fibers, or fiber bundles must be planned ahead of time within a typical program timeline to allow for sufficient time to receive, test and possibly modify the thermal straps. Special materials and processes are utilized to form the multi-layer/multi-fiber straps that tend to increase the material and processing costs and additionally the delivery schedule of the final strap. The cost and schedule are only linearly exacerbated if multiple straps are needed to heat connect multiple thermal generation points to corresponding cold points. The use of graphene paper straps provides a path for a less expensive strap that requires less fabrication time to enable a "just in time" implementation of the strap.

SUMMARY

This disclosure provides a system and method for reducing the cost and schedule for manufacturing of graphene paper based thermal straps and harnesses.

In a first embodiment, a graphene strap includes a plurality of graphene strips, a metal additive, and a binding material. The plurality of graphene strips includes strips of graphene nanoplatelets. The metal additive is applied to each of the plurality of graphene strips. The binding material couples the plurality of graphene strips together.

In a second embodiment, a method includes forming a plurality of graphene strips comprising strips of graphene nanoplatelets. The method also includes applying a metal additive to each of the plurality of graphene strips. The method further includes coupling the plurality of graphene strips together using a binding material.

In a third embodiment, an electronic device includes a heat-generating component and a graphene strap. The graphene strap includes a plurality of graphene strips, a metal additive, and a binding material. The plurality of graphene strips includes strips of graphene nanoplatelets. The metal additive is applied to each of the plurality of graphene strips. The binding material couples the plurality of graphene strips together.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1A through 4, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and not meant to imply that the feature or component cannot be employed in the embodiment(s) described in connection with that figure.

It will be understood that embodiments of this disclosure may include any one, more than one, or all of the features described here. Also, embodiments of this disclosure may additionally or alternatively include other features not listed here. While the disclosed embodiments are described with respect to thermal straps and harnesses, these embodiments are also applicable in any other suitable systems or applications.

Figure 1A:
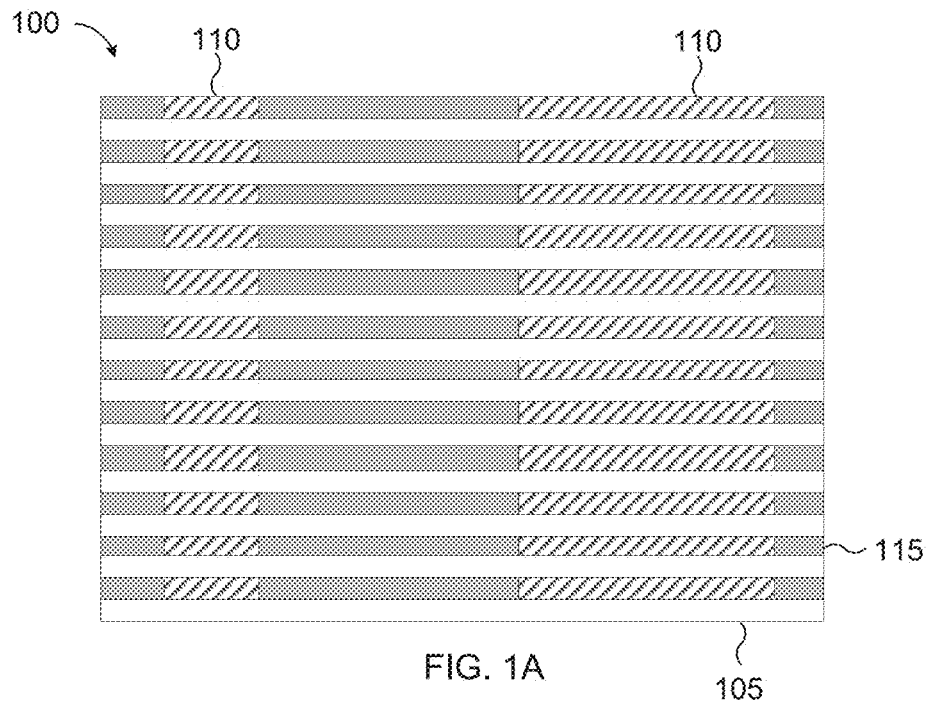
FIGS. 1A and 1B illustrate an example a multi-layer graphene strap according to this disclosure.
Figure 1B:
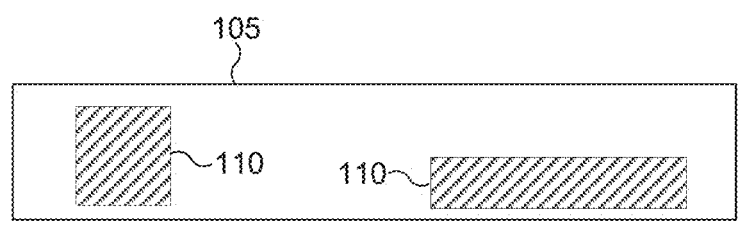

FIGS. 1A and 1B illustrate an example a multi-layer graphene strap 100 according to this disclosure. In particular, FIG. 1A illustrates a side view of the graphene strap 100, while FIG. 1B illustrates a top view of the graphene strap 100. The graphene strap 100 may be produced using the manufacturing system 200 of FIG. 2. The embodiments of the graphene strap 100 illustrated in FIGS. 1A and 1B are for illustration only. FIGS. 1A and 1B do not limit the scope of this disclosure to any particular implementation.

The graphene strap 100 is used to transfer heat in electronic devices and other heat transfer applications. The graphene strap 100 is multi-layered for a higher efficiency of heat transfer. The graphene strap 100 is comprised of a plurality of graphene strips 105, a plurality of metal additives 110, and binding material 115. The graphene strap 100 and the graphene strips 105 provide a reduction in size, weight, and power.

The graphene strips 105 are strips of graphene nanoplatelets. The graphene strips 105 are structured by pressing graphene nanoplatelets together. A plurality of graphene strips 105 are used in each graphene strap 100. The graphene strips 105 are cut and shaped according to a suitable implementation. In certain embodiments, ten graphene strips are used in a graphene strap. Of course, this is merely one example; other embodiments may include more or fewer graphene strips. As illustrated in FIGS. 1A and 1B, the graphene strips 105 are rectangular, but can be cut or shaped to bend or wrap around components.

Metal additives 110 are applied to each of the graphene strips 105. One or more portions of the graphene strip 105 can have the metal additives 110 applied. Each metal additive 110 can be applied in the shape of a surface area of the component for which heat dispersion is required. The metal additive 110 can also be applied at a location where the heat is to be dispersed, for example a heat fin. The metal additive 110 can be a material with high thermal conductivity, such as copper or silver.

The binding material 115 is used to bind the graphene strips 105 together. The binding material 115 can be any material used for soldering. The binding material 115 is applied across the plurality of graphene strips 105 in locations where the metal additive 110 was not added. The binding material 115 can be applied using a binding technique, such as a solder paste reflow.

Although FIGS. 1A and 1B illustrate one example of a multi-layer graphene strap 100, various changes may be made to FIGS. 1A and 1B. For example, the makeup and arrangement of the graphene strips 105, the metal additive 110, and the binding material 115 in the graphene strap 100 are for illustration only. In general, components could be added, omitted, combined, or placed in any other configuration according to particular needs.

Figure 2:
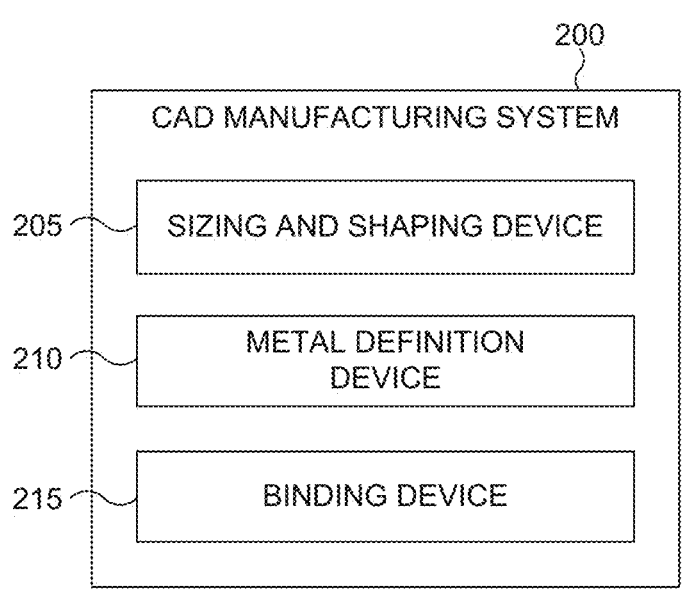
FIG. 2 illustrates an example computer aided design (CAD) controlled manufacturing system according to this disclosure.

FIG. 2 illustrates an example computer aided design (CAD) controlled manufacturing system 200 according to this disclosure. The embodiment of the CAD controlled manufacturing system 200 illustrated in FIG. 2 is for illustration only. FIG. 2 does not limit the scope of this disclosure to any particular implementation.

The system 200 is designed to produce graphene straps or harnesses. The system 200 can include or be controlled by a computing device, such as the device 100 of FIG. 1. The system 200 includes a sizing and shaping device 205, a metal definition technique device 210, and a binding device 215.

The sizing and shaping device 205 is used to form a plurality of graphene strips. The strips are sized and shaped suitable to an implementation in a device or apparatus for thermal management. The sizing and shaping device 205 can include any suitable structure that is capable of performing sizing and shaping techniques such as, for example, laser cutting, conventional cutting methods, and the like.

The metal definition device 210 applies a metal to the surface of each of the plurality of graphene strips. The metal additive is used to provide an interface between the graphene and a solderable surface. The metal additive is applied in locations of the graphene straps that require heat transfer in the z direction. As used herein, the "z direction" refers to a direction in which multiple graphene strips are stacked together, as described in greater detail in FIGS. 1A and 1B above. The metal additive is thicker at points where a component is a distance away from the graphene strips. The metal additive can be applied uniformly across the plurality of graphene strips or differently according to the optimal heat transfer path. The metal additive is applied to the graphene strips to provide thermal routing for the implementation. The metal definition device 210 can include any suitable structure capable of performing metal definition techniques. Examples of metal definition techniques include electroplating, vapor deposition, sputtering, fired pasting, and the like. The specific metals chosen for the metal additives have a high heat conductivity. Examples of metal additives include copper and silver.

The binding device 215 binds the plurality of graphene strips into a graphene strap or harness. A binding method is applied to each of the graphene strips to form the graphene strap or harness. The binding device 215 can include any suitable structure capable of performing binding methods. An example of a binding method includes solder paste reflow. In solder paste reflow, solder is applied between each layer of the graphene strip and heated to form a graphene strap or harness.

Although FIG. 2 illustrates one example of a CAD controlled manufacturing system 200, various changes may be made to FIG. 2. For example, the makeup and arrangement of the components of the system 200 are for illustration only. In general, manufacturing systems are highly configurable, and components could be added, omitted, combined, or placed in any other configuration according to particular needs.

Figure 3:
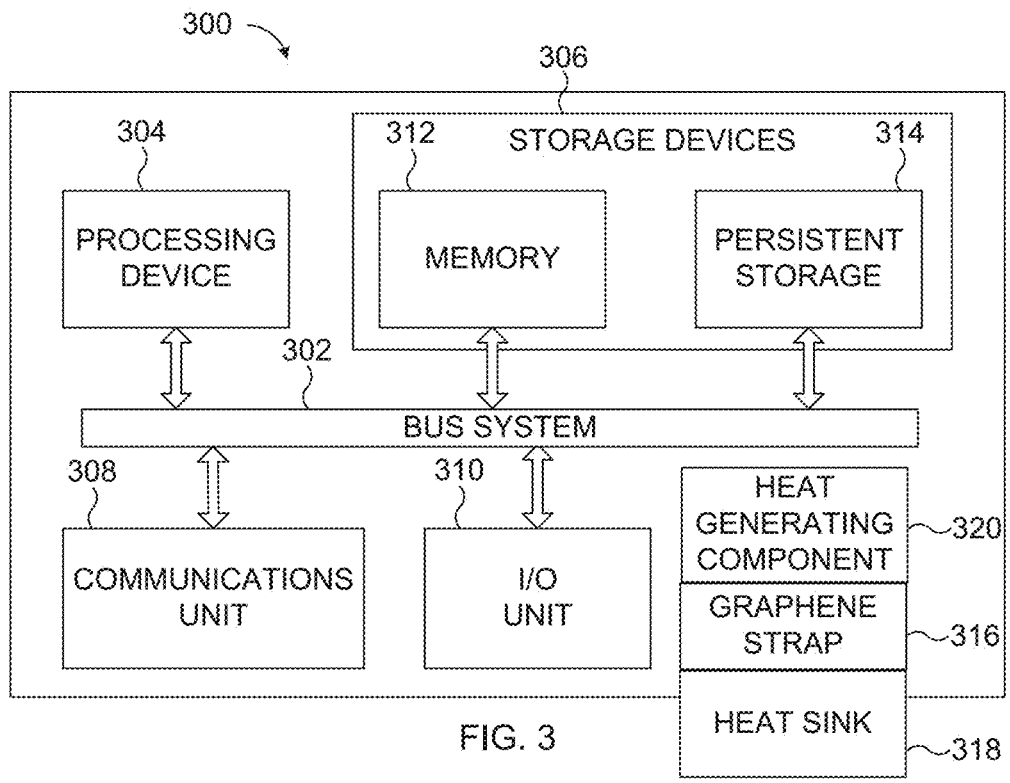
FIG. 3 illustrates an example device for performing various operations according to this disclosure.

FIG. 3 illustrates an example device 300 for performing various operations according to this disclosure. The device 300 could, for example, represent a computing device for controlling a computer aided design (CAD) controlled manufacturing system, such as the CAD controlled manufacturing system 200 of FIG. 2 (described below). As another example, the device 300 could represent a computing device for implementing or controlling all or portions of the method 400 of FIG. 4 (described below). The device 300 could represent any other suitable device.

As shown in FIG. 3, the device 300 can include a bus system 302, which supports communication between at least one processing device 304, at least one storage device 306, at least one communications unit 308, at least one input/output (I/O) unit 310, at least one graphene strap 316, and at least one heat sink 318. The processing device 304 executes instructions that may be loaded into a memory 312. The processing device 304 may include any suitable number(s) and type(s) of processors or other devices in any suitable arrangement. Example types of processing devices 304 include microprocessors, microcontrollers, digital signal processors, field programmable gate arrays, application specific integrated circuits, and discrete circuitry.

The memory 312 and a persistent storage 314 are examples of storage devices 306, which represent any structure(s) capable of storing and facilitating retrieval of information (such as data, program code, and/or other suitable information on a temporary or permanent basis). The memory 312 may represent a random access memory or any other suitable volatile or non-volatile storage device(s). The persistent storage 314 may contain one or more components or devices supporting longer-term storage of data, such as a ready only memory, hard drive, Flash memory, or optical disc. In accordance with this disclosure, the memory 312 and the persistent storage 314 may be configured to store instructions associated with manufacturing of graphene paper based thermal straps and harnesses.

The thermal conductivity of graphene paper is higher than standard metals (i.e. copper, aluminum) for a wide range of temperatures. The significantly lower density allows the strap or harness to be significantly lighter than copper or aluminum analogs while exhibiting the same performance. The multi-layer graphene paper thermal straps possess greater flexibility than the metal analogs. This flexibility provides easier installation between fixed thermal access points. The graphene paper can be formed into complex shapes, which allow multi-point loads to be harnessed to a cold sink. Multiple single point to single point thermal straps can be consolidated into one multi-point to sink point thermal harness. Due to its flexibility, the strap or harness acts as an exported disturbance dampener when connected to a mechanical cooling device.

The communications unit 308 supports communications with other systems, devices, or networks. For example, the communications unit 308 could include a network interface that facilitates communications over at least one Ethernet network. The communications unit 308 could also include a wireless transceiver facilitating communications over at least one wireless network. The communications unit 308 may support communications through any suitable physical or wireless communication link(s).

The I/O unit 310 allows for input and output of data. For example, the I/O unit 310 may provide a connection for user input through a keyboard, mouse, keypad, touchscreen, or other suitable input device. The I/O unit 310 may also send output to a display, printer, or other suitable output device.

The heat sink 318 efficiently disperses heat from the electronic device 300. The graphene strap 316 transfers heat from the different heat generating components, which includes the at least one processing device 304, the at least one storage device 306, the at least one communications unit 308, and the at least one I/O unit 310. The graphene strap 316 could be represented by the graphene strap 100 of FIG. 1. The metal additives 110 can be applied on the heat sink 318 at the locations of the heat generating components of the electronic device 300.

Although FIG. 3 illustrates one example of a device 300 for performing various operations, various changes may be made to FIG. 3. For example, various components in FIG. 3 could be combined, further subdivided, or omitted and additional components could be added according to particular needs. Also, computing devices can come in a wide variety of configurations, and FIG. 3 does not limit this disclosure to any particular configuration of device.

Figure 4:
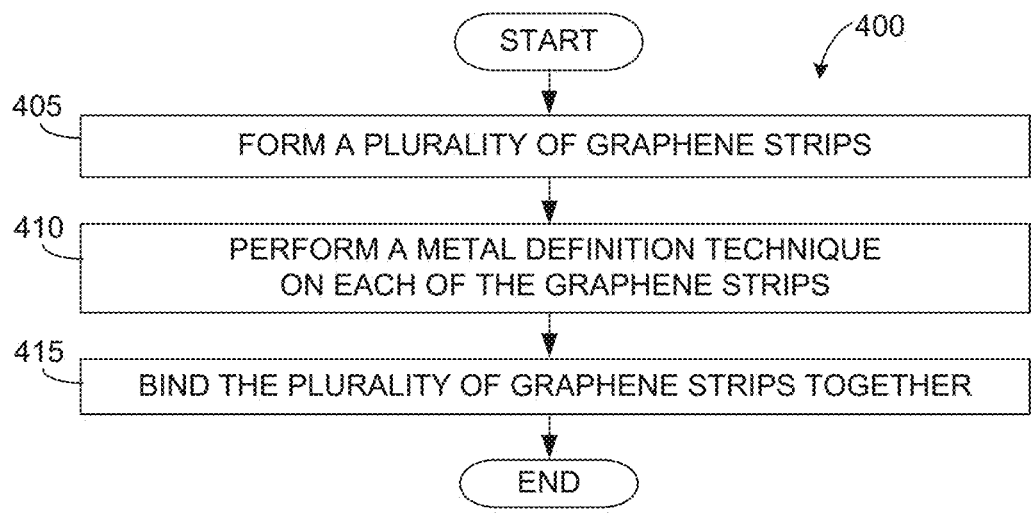
FIG. 4 illustrates an example method for manufacturing of graphene paper based thermal straps and harnesses according to this disclosure.

FIG. 4 illustrates an example method 400 for manufacturing of graphene paper based thermal straps and harnesses according to this disclosure. For ease of explanation, the method 400 is described as being performed using the CAD controlled manufacturing system 200 of FIG. 2 and the device 100 of FIG. 1. However, the method 400 could be used with any other suitable system.

In operation 405, the system 200 forms a plurality of graphene strips. This may include, for example, the sizing and shaping device 205 forming a plurality of graphene strips. The strips are sized and shaped to be suitable for an implementation in a device or apparatus for thermal management. The sizing and shaping device 205 can include any suitable structure that is capable of performing sizing and shaping techniques such as, for example, laser cutting, conventional cutting methods, and the like.

In operation 410, the system 200 performs a metal definition technique to each of the plurality of graphene strips. This may include, for example, the metal definition device 210 applying a metal to the surface of each of the plurality of graphene strips. The metal additive is used to provide an interface between the graphene and a solderable surface. The metal additive is applied in locations of the graphene straps that require heat transfer in the z direction. The metal additive is thicker at points where a component is a distance away from the graphene strips. The metal additive can be applied uniformly across the plurality of graphene strips or differently according to the optimal heat transfer path. The metal additive is applied to the graphene strips to provide thermal routing for the implementation. The metal definition device 210 can include any suitable structure capable of performing metal definition techniques. Examples of metal definition techniques include electroplating, vapor deposition, sputtering, fired pasting, and the like. The specific metals chosen for the metal additives have a high heat conductivity. Examples of metal additives include copper and silver.

In operation 415, the system 200 binds the plurality of graphene strips together. This may include, for example, the binding device 215 binding the plurality of graphene strips into a graphene strap or harness. The binding device 215 can include any suitable structure capable of performing binding methods. An example of a binding method includes solder paste reflow. In solder paste reflow, solder is applied between each layer of the graphene strip and heated to form a graphene strap or harness.

Although FIG. 4 illustrates one example of a method 400 for manufacturing of graphene paper based thermal straps and harnesses, various changes may be made to FIG. 4. For example, while shown as a series of steps, various steps shown in FIG. 4 could overlap, occur in parallel, occur in a different order, or occur multiple times. Moreover, some steps could be combined or removed and additional steps could be added according to particular needs.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to)

"mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A graphene strap comprising:
   a plurality of graphene strips comprising strips of graphene nanoplatelets;
   a metal additive applied to each of the plurality of graphene strips that does not pass through the graphene strips; and
   a binding material configured to couple the plurality of graphene strips together;
   wherein at least some of the metal additive is positioned between adjacent pairs of the graphene strips.

2. The graphene strap of claim 1, wherein:
   the graphene strips include a first graphene strip and a second graphene strip; and
   the metal additive is applied to a surface of the first graphene strip.

3. The graphene strap of claim 1, wherein:
   the metal additive comprises electroplated metal, and
   the electroplated metal comprises at least one of: copper and silver.

4. The graphene strap of claim 1, wherein the binding material comprises a solder paste reflow.

5. The graphene strap of claim 1, wherein each graphene strip is structured with graphene nanoplatelets pressed together.

6. A graphene strap comprising:
   a plurality of graphene strips comprising strips of graphene nanoplatelets;
   a metal additive applied to each of the plurality of graphene strips; and
   a binding material configured to couple the plurality of graphene strips together;
   wherein:
      the graphene strips include a first graphene strip and a second graphene strip;
      the metal additive is applied to a surface of the first graphene strip; and
      the binding material is applied on the surface of the first graphene strip in locations where the metal additive is not applied.

7. The graphene strap of claim 6, wherein the binding material couples the first graphene strip and the second graphene strip around the metal additive.

8. A graphene strap comprising:
   a plurality of graphene strips comprising strips of graphene nanoplatelets;
   a metal additive applied to each of the plurality of graphene strips; and
   a binding material configured to couple the plurality of graphene strips together;
   wherein the metal additive is configured to provide thermal routing.

9. The graphene strap of claim 8, wherein the metal additive is applied equally to each of the graphene strips.

10. A method comprising:
    forming a plurality of graphene strips comprising strips of graphene nanoplatelets;
    applying a metal additive to each of the plurality of graphene strips such that the metal additive does not pass through the graphene strips; and
    coupling the plurality of graphene strips together using a binding material;
    wherein at least some of the metal additive is positioned between adjacent pairs of the graphene strips.

11. The method of claim 10, wherein:
    the graphene strips include a first graphene strip and a second graphene strip; and
    the metal additive is applied to a surface of the first graphene strip.

12. The method of claim 10, wherein the binding material comprises a solder paste reflow.

13. The method of claim 10, wherein each graphene strip is structured with graphene nanoplatelets pressed together.

14. A method comprising:
    forming a plurality of graphene strips comprising strips of graphene nanoplatelets;
    applying a metal additive to each of the plurality of graphene strips such that the metal additive does not pass through the graphene strips; and
    coupling the plurality of graphene strips together using a binding material;
    wherein:
       applying the metal additive comprises electroplating one or more metals, and
       the one or more metals comprise at least one of: copper and silver.

15. A method comprising:
    forming a plurality of graphene strips comprising strips of graphene nanoplatelets;
    applying a metal additive to each of the plurality of graphene strips; and
    coupling the plurality of graphene strips together using a binding material;
    wherein:
       the graphene strips include a first graphene strip and a second graphene strip;
       the metal additive is applied to a surface of the first graphene strip; and
       the binding material is applied on the surface of the first graphene strip in locations where the metal additive is not applied.

16. The method of claim 15, wherein the binding material couples the first graphene strip and the second graphene strip around the metal additive.

17. A method comprising:
    forming a plurality of graphene strips comprising strips of graphene nanoplatelets;
    applying a metal additive to each of the plurality of graphene strips; and
    coupling the plurality of graphene strips together using a binding material;
    wherein the metal additive is configured to provide thermal routing.

18. The method of claim 17, wherein the metal additive is applied equally to each of the graphene strips.

19. An electronic device comprising:
    a heat-generating component; and
    a graphene strap comprising:

a plurality of graphene strips comprising strips of graphene nanoplatelets;

a metal additive applied to each of the plurality of graphene strips that does not pass through the graphene strips; and a binding material configured to couple the plurality of graphene strips together;

wherein at least some of the metal additive is positioned between adjacent pairs of the graphene strips.

20. The electronic device of claim 19, wherein:

the graphene strips include a first graphene strip and a second graphene strip; and the metal additive is applied to a surface of the first graphene strip.

\* \* \* \* \*